United States Patent [19]

Taneya et al.

[11] Patent Number: 4,632,709
[45] Date of Patent: Dec. 30, 1986

[54] PROCESS FOR PREVENTING MELT-BACK IN THE PRODUCTION OF ALUMINUM-CONTAINING LASER DEVICES

[75] Inventors: Mototaka Taneya; Sadayoshi Matsui; Mitsuhiro Matsumoto, all of Tenri; Hiroshi Hayashi, Kyoto, all of Japan

[73] Assignee: Sharp Kabushiki Kaisha, Osaka, Japan

[21] Appl. No.: 781,707

[22] Filed: Sep. 30, 1985

[30] Foreign Application Priority Data

Oct. 2, 1984 [JP] Japan .................................. 59-206930

[51] Int. Cl.[4] .......................................... H01L 21/208
[52] U.S. Cl. .................................. 148/171; 29/569 L; 29/576 E; 148/172
[58] Field of Search ............... 148/171, 172; 29/569 L, 29/576 E

[56] References Cited

U.S. PATENT DOCUMENTS

| | | | |
|---|---|---|---|
| 4,099,999 | 7/1978 | Burnham et al. | 148/171 X |
| 4,110,133 | 8/1978 | Garrett et al. | 148/171 |
| 4,255,206 | 3/1981 | Endler et al. | 148/171 |
| 4,371,968 | 2/1983 | Trussell et al. | 148/171 X |
| 4,509,996 | 4/1985 | Greene et al. | 29/569 L X |
| 4,547,396 | 10/1985 | Botez et al. | 148/171 X |
| 4,547,956 | 10/1985 | Bouadma et al. | 148/171 X |
| 4,561,915 | 12/1985 | Mito | 148/171 |

*Primary Examiner*—George T. Ozaki
*Attorney, Agent, or Firm*—Birch, Stewart, Kolasch & Birch

[57] ABSTRACT

A process for the production of semiconductor devices includes: (1) forming a thin semiconductor film containing no aluminum on a first semiconductor layer containing aluminum that is disposed on a substrate one or more (2) forming channels on said thin semiconductor film in such a manner that the channel or channels reach or go through said first semiconductor layer to expose a portion of said substrate, resulting in a channelled substrate for succeeding crystal growth thereon, and (3) producing by epitaxial growth crystalline layers on said channelled substrate by the use of a crystal growth solution having a supersaturation which is high enough to prevent said first semiconductor layer from undergoing meltback.

4 Claims, 9 Drawing Figures

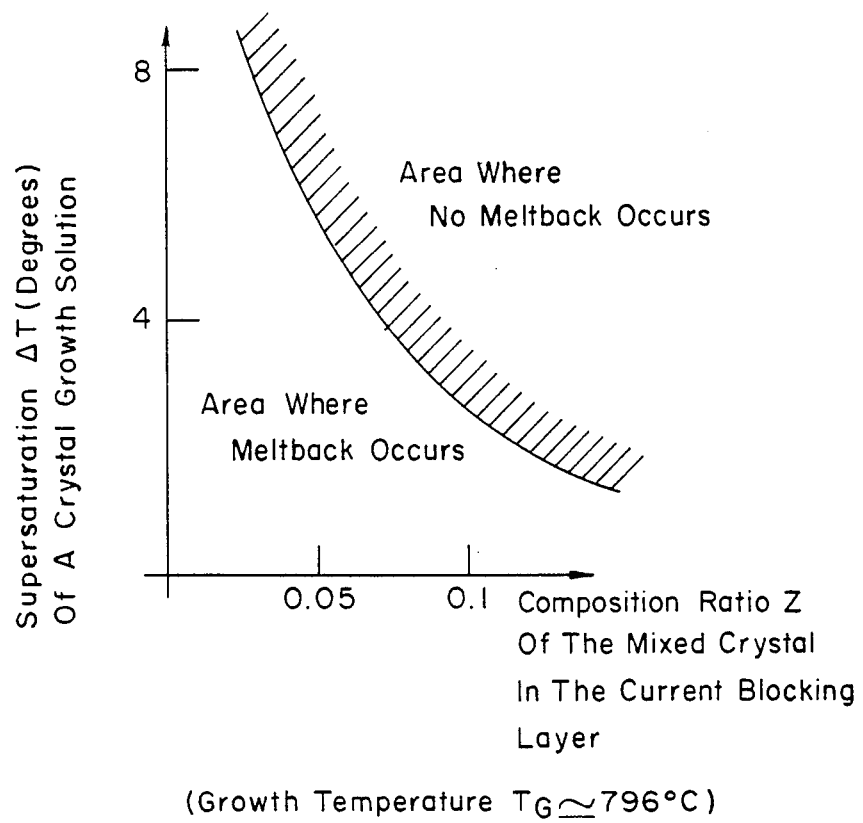

PRIOR ART

PROCESS FOR PREVENTING MELT-BACK IN THE PRODUCTION OF ALUMINUM-CONTAINING LASER DEVICES

BACKGROUND OF THE INVENTION

1. Field of the Invention

This invention relates to a process for the production of semiconductor devices by which a liquid phase epitaxial growth can be attained without meltback in the channelled substrate since the channelled substrate includes a semiconductor layer containing aluminum.

2. Description of the Prior Art

With the development of optical devices, a liquid phase epitaxial growth technique using group III-V semiconductor compounds (especially, $Al_xGa_{1-x}As$) has been widely applied to the production of semiconductor laser devices, light emitting diodes, etc. These devices are produced by the liquid phase epitaxial growth of crystalline layers on the channelled substrate resulting in a variety of structures.

However, during the liquid phase epitaxial growth of crystalline layers on the channelled substrate, each of the shoulder portions of both sides of the channel undergoes meltback resulting in a rounded shape. For example, FIGS. 4(a) and 4(b) show a conventional production process of semiconductor laser devices, FIG. 4(a) showing a sectional view of the channelled substrate and FIG. 4(b) showing a sectional view of the current blocking wafer. On a p-GaAs substrate 1, an n-GaAs current blocking layer 2 is formed by liquid phase epitaxy, molecular beam epitaxy, metal-organic-chemical vapor deposition, etc., followed by the formation of a channel on the surface of the substrate 1 by the use of photolithography and an etching technique (FIG. 4(a)). Then, on the resulting channelled substrate 21, a p-$Al_xGa_{1-x}As$ cladding layer 3, an $Al_yGa_{1-y}As$ active layer 4, an n-$Al_xGa_{1-x}As$ cladding layer 5 and an n+-GaAs cap layer 6 are successively formed by liquid phase epitaxy (wherein, $0 \leq Y \leq X \leq 1$) (FIG. 4(b)). During the successive growth of the crystalline layers on the channelled substrate 21, the shoulder portions of the channel undergo meltback into a crystal growth solution resulting in a rounded shape, so that the width of the channel expands to a certain extent, causing changes in the width of an electric current injection region and-/or an optical waveguide, and resulting in a great variability in the device characteristics. In order to produce devices having uniform characteristics, meltback in the channel of the substrate must be prevented during the successive growth of the crystalline layers on the channelled substrate.

SUMMARY OF THE INVENTION

The process for the production of semiconductor devices of this invention which overcomes the above-discussed and numerous other disadvantages and deficiencies of the prior art, comprises (1) forming a thin semiconductor film containing no aluminum on a first semiconductor layer containing aluminum, (2) forming a channel or channels on said thin semiconductor film in such a manner that the channel or channels reach or go through said first semiconductor layer, resulting in a channeled substrate for the succeeding crystal growth thereon, and (3) attaining the epitaxial growth of crystalline layers on said channelled substrate by the use of a crystal growth solution having a supersaturation which is high enough to prevent said first semiconductor layer from undergoing meltback. The substrate has, in a preferred embodiment, a plurality of striped channels.

The crystalline layers comprise, in a preferred embodiment, a second semiconductor layer serving as an active region for emitting laser light, a third semiconductor layer positioned under said second semiconductor layer and a fourth semiconductor layer positioned above said second semiconductor layer, both said third and fourth layers having a wider forbidden band than said second layer and the polarity of said third layer being different from that of said fourth layer, and said first layer having a narrower forbidden band than said second layer. The substrate has, in a preferred embodiment, a plurality of striped channels.

Thus, the invention described herein makes possible the object of providing a process for the production of semiconductor devices in which the growth of semiconductor crystalline layers can be attained by liquid phase epitaxy without deformation in the channel of the substrate, so that the production of devices can be controlled accurately, thereby attaining high yield devices.

BRIEF DESCRIPTION OF THE DRAWINGS

This invention may be better understood and its numerous objects and advantages will become apparent to those skilled in the art by reference to the accompanying drawings as follows:

FIG. 2 is a graph showing the boundary condition with respect to meltback in the channelled substrate.

DESCRIPTION OF THE PREFERRED EMBODIMENTS

The process for the production of semiconductor devices according to the present invention comprises forming a thin semiconductor film containing no Al on a semiconductor layer containing Al; forming a channel or channels on said thin semiconductor film in such a manner that the channel or channels reach or go through said Al-containing semiconductor layer resulting in a channelled substrate for the succeeding crystal growth thereon; and attaining the epitaxial growth of crystalline layers on said channelled substrate without deformation in the channel or channels of said substrate by the use of a crystal growth solution having a supersaturation which is high enough to prevent said Al-containing semiconductor layer from undergoing meltback.

Figure 1A:
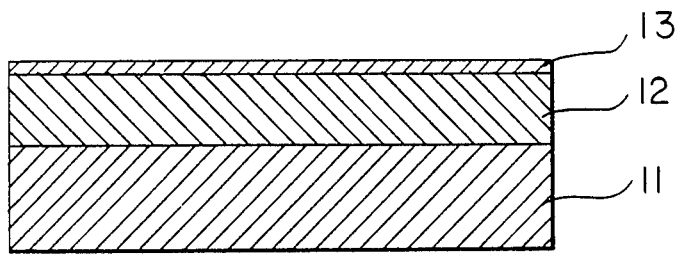
FIGS. 1(a), 1(b) and 1(c), respectively, are sectional views showing a production process of semiconductor devices according to the present invention.
Figure 1B:
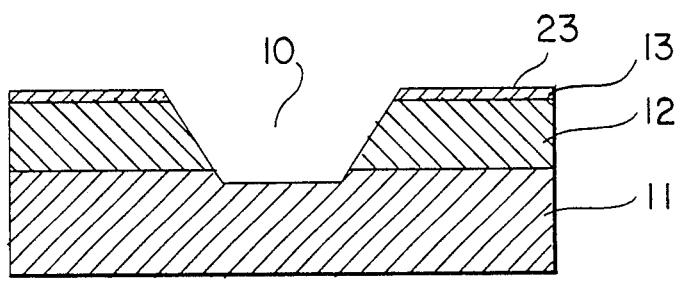
Figure 1C:
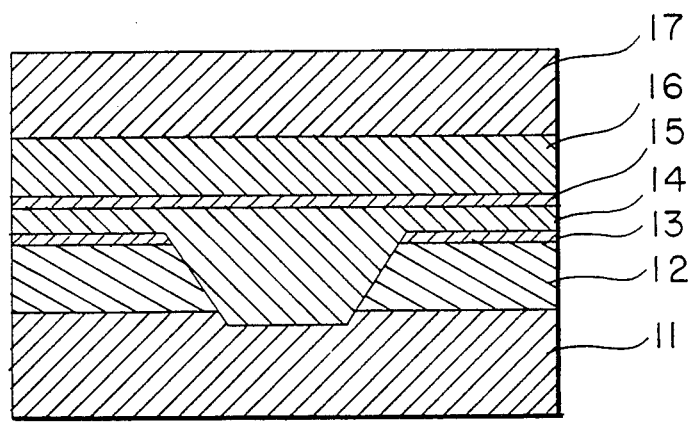

FIGS. 1(a), 1(b) and 1(c) show the production process of a semiconductor device of this invention. First, as shown in FIG. 1(a), on the (100) face of a p-GaAs substrate 11, an n-$Al_zGa_{1-z}As$ current blocking layer 12 having a thickness of 0.7 μm and an n- or p-GaAs protecting layer 13 having a thickness of 0.1 μm are successively formed by liquid phase epitaxy or other crystal growth techniques known to those skilled in the art. In this growth process, the composition ratio Z of the mixed crystal in the n-current blocking layer 12 is selected from the shaded area indicated in FIG. 2 depending upon the supersaturation of a crystal growth solution which is used for the succeeding crystal growth of crystalline layers on the channelled substrate 23 (FIG. 1(b)). In this example, the supersaturation $\Delta T$ of the crystal growth solution was selected to be 4 degrees and the composition ratio Z of the mixed crystal in the n-current blocking layer 12 was selected to be 0.1. Such a selection (i.e., $\Delta T=4$ degrees) allows accurate control of the thickness of the p-cladding layer 14 and the active layer 15 in the succeeding growth processes, resulting in uniform quality devices.

Figure 4A:
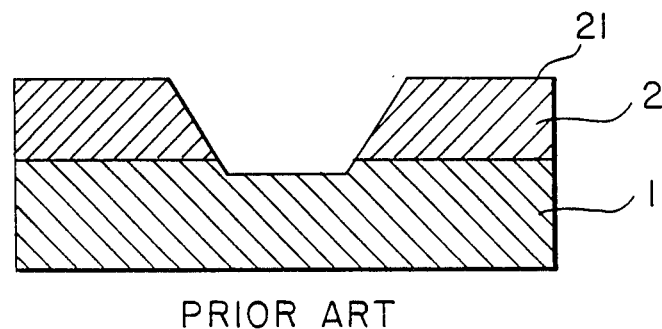
FIGS. 4(a) and 4(b), respectively, are sectional views showing a conventional production process of semiconductor devices.
Figure 4B:
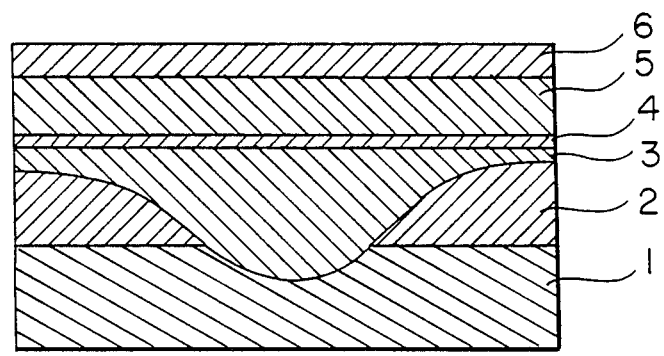

The resulting laminated crystal is then subjected to photolithography and an etching treatment, as shown in FIG. 1(b), to form a striped channel 10 having a depth of approximately 1.0 μm in the (011) direction of the crystal in such a manner that the channel 10 goes through the n-current blocking layer 12 and reaches the p-GaAs substrate 11, resulting in a channelled substrate 23 for the succeeding crystal growth thereon in which only part of the Al-containing layer 12, which is exposed, is the sloped surface in the channel 10 and all of the plane surface of the Al-containing layer 12 is covered with the thin GaAs layer 13 serving to protect the Al-containing layer 12 against oxidation. If the thin GaAs layer 13 did not exist, as in the conventional channelled substrate 21 shown in FIG. 4(a), the wettability of the channelled substrate by the crystal growth solution would be reduced in the succeeding crystal growth processes, resulting in only partial growth of the crystalline layers in the vicinity of the channel.

Then, as shown in FIG. 1(c), the successive growth of a double heterostructure is carried out using the above-mentioned channelled substrate 23 to form a p-$Al_xGa_{1-x}As$ cladding layer 14, an $Al_yGa_{1-y}As$ active layer 15, an n-$Al_xGa_{1-x}As$ cladding layer 16 and an n+-GaAs cap layer 17 (wherein $0<z<y\leq x<1$) by liquid phase epitaxy. The liquid phase epitaxy can be carried out as follows: Each of the semiconductor compounds is first weighed depending upon the composition and the carrier concentration of the corresponding crystalline layer and put into a sliding boat, which is then left at 800° C. for a certain period within a purified hydrogen atmosphere to completely melt the compound. Then, the boat is cooled to 796° C. to attain a supersaturation of the molten solution. The resulting crystal growth solution for the first crystalline layer (i.e., the p-cladding layer) 14 is then in contact with the channelled substrate 23 (FIG. 1(b)). Since the growth rate of the crystalline layer grown initially on the sloped surface of the channel 10 is so high that there is an insufficient amount of solute in the shoulder portions of the channel 10 (i.e., the area of the (100) face in the vicinity of the channel 10), so that meltback of the shoulder portions of the channel 10 tends to occur. However, since the n-current blocking layer 12 is composed of the $Al_{0.1}Ga_{0.9}As$ system according to this invention, the meltback in the channel 10 can be prevented so that the channel 10 in the substrate 23 for the crystal growth is filled with the p-cladding layer 14 having a plane surface and the initial shape of the channel 10 can be maintained without deformation.

Using the above-mentioned processes, a semiconductor laser device having an oscillation wavelength of 780 nm and a threshold current of 30 mA was produced with an excellent reproducibility.

Figure 3A:
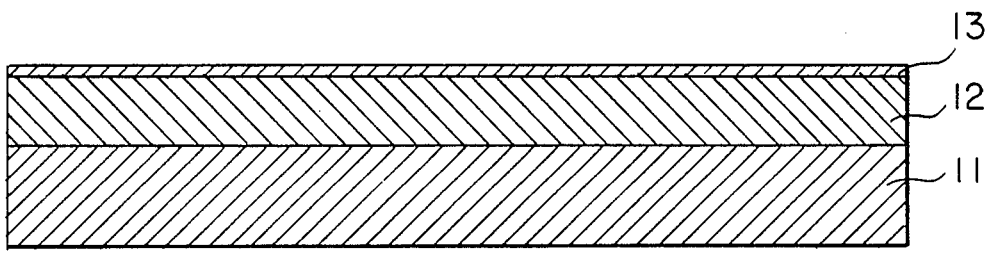
FIGS. 3(a), 3(b) and 3(c), respectively, are sectional views showing another production process of semiconductor devices of the present invention.
Figure 3B:
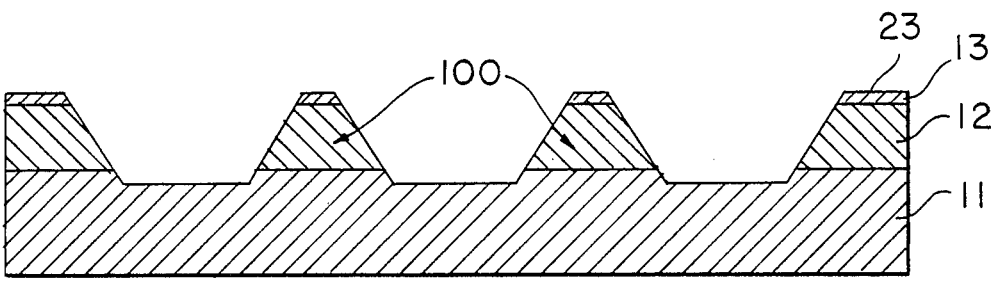
Figure 3C:
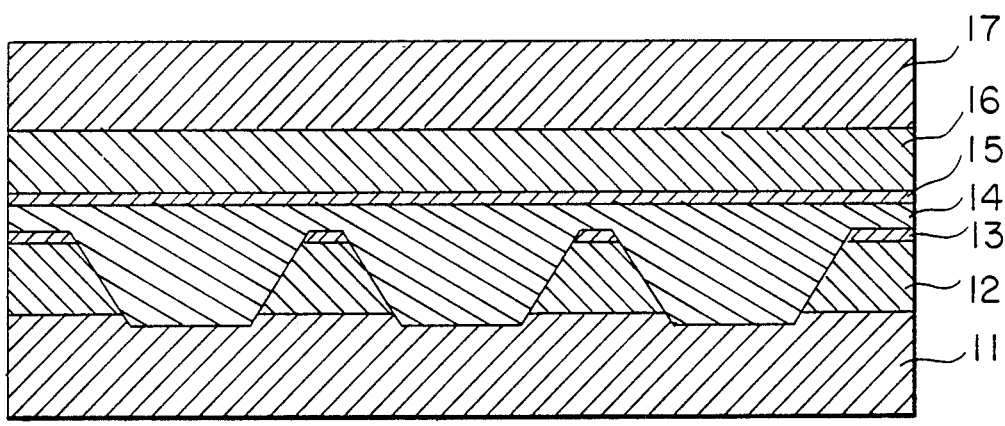

FIGS. 3(a), 3(b) and 3(c) show another production process of a semiconductor device of this invention, by which a semiconductor laser array device including a plurality of striped channels (e.g., three striped channels) can be produced as follows: Reference numerals 11-17 in FIGS. 3(a)-3(c) indicate the same layers as those numerals 11-17 in FIGS. 1(a)-1(c). The laminated crystal (shown in FIG. 3(a)) produced in the same manner as in the above-mentioned Example (shown in FIG. 1(a)) is subjected to photolithography and an etching treatment to form three striped channels (each of which has a width of 4.2 μm, a pitch of 5.0 μm and a depth of 1.0 μm) in the (011) direction of the crystal, followed by the growth of a double heterostructure for a laser device under the same conditions as in the above-mentioned Example. If a conventional process were applied to this Example, the convex portions 100 would undergo meltback and would be lost, resulting in a semiconductor laser array device including one channel which has a width of as great as 15 μm. According to this invention, a semiconductor laser array device in which the initial shapes of the convex portions 100 and the shoulder portions of the channels were maintained was obtained. Its threshold current was in the range of 95 to 100 mA which is slightly scattered. Moreover, since these three striped channels can be formed into the same shape, it was observed that the far-field pattern by this semiconductor laser array device exhibits a single sharp peak having a lobe full-width of the half maximum of approximately 3° and the optical phase shift between the adjacent striped channels is 0°.

Various modifications of the semiconductor device of this invention include:

(i) Devices which are designed to provide a structure having a different polarity from the polarity of each of the substrates and growth layers in the above-mentioned Examples.

(ii) Other semiconductor lasers and/or semiconductor devices using a channelled substrate.

(iii) Devices which are designed using other semiconductor materials containing Al.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A process for the production of semiconductor devices comprising:

(1) forming a thin semiconductor film containing no aluminum on a first semiconductor layer containing aluminum successively on a substrate, (2) forming one or more channels on said thin semiconductor film, said channels reach or go through said first semiconductor layer, to produce a channeled substrate for the succeeding crystal growth thereon, and (3) attaining the epitaxial growth of crystalline layers on said channelled substrate by the use of a crystal growth solution having a supersaturation which is high enough to prevent said first semiconductor layer from undergoing meltback.

2. A process for the production of semiconductor devices according to claim 1, wherein said crystalline layers comprise a second semiconductor layer serving as an active region for emitting laser light, a third semiconductor layer positioned under said second semiconductor layer and on said third semiconductor film and a fourth semiconductor layer positioned above said second semiconductor layer, both said third and fourth layers having a wider forbidden band than said second semiconductor layer and the polarity of said third semiconductor layer being different from that of said fourth semiconductor layer, and said first semiconductor layer having a narrower forbidden band than said second semiconductor layer.

3. A process for the production of semiconductor devices according to claim 1, wherein said substrate has a plurality of striped channels.

4. A process for the production of semiconductor devices according to claim 2, wherein said substrate has a plurality of striped channels.

* * * * *